(12) United States Patent
Goida

(10) Patent No.: US 8,946,879 B2
(45) Date of Patent: Feb. 3, 2015

(54) PACKAGES AND METHODS FOR 3D INTEGRATION INCLUDING TWO STACKED DIES WITH A PORTION OF ONE DIE EXTENDING INTO A HOLE OF THE OTHER DIE

(75) Inventor: Thomas Goida, Windham, NH (US)

(73) Assignee: Analog Devices, Inc., Norwood, MA (US)

( * ) Notice: Subject to any disclaimer, the term of this patent is extended or adjusted under 35 U.S.C. 154(b) by 172 days.

(21) Appl. No.: 13/560,855

(22) Filed: Jul. 27, 2012

(65) Prior Publication Data

US 2014/0027867 A1   Jan. 30, 2014

(51) Int. Cl.
*H01L 23/31* (2006.01)
*H01L 23/367* (2006.01)
*H01L 23/538* (2006.01)

(52) U.S. Cl.
CPC .......... *H01L 23/3121* (2013.01); *H01L 23/367* (2013.01); *H01L 23/3675* (2013.01); *H01L 23/5389* (2013.01)
USPC ............ 257/686; 257/415; 257/712; 257/777

(58) Field of Classification Search
CPC .................................................. H01L 23/3675
See application file for complete search history.

(56) References Cited

U.S. PATENT DOCUMENTS

| | | | |
|---|---|---|---|
| 5,247,597 A | 9/1993 | Blacha et al. | |
| 6,489,686 B2 | 12/2002 | Farooq et al. | |
| 6,787,916 B2 | 9/2004 | Halahan | |
| 7,209,362 B2 | 4/2007 | Bando | |
| 7,858,437 B2 | 12/2010 | Jung et al. | |
| 8,115,307 B2 | 2/2012 | Toyama et al. | |
| 8,399,994 B2* | 3/2013 | Roh et al. | 257/777 |
| 2009/0070727 A1 | 3/2009 | Solomon | |
| 2010/0019393 A1 | 1/2010 | Hsieh et al. | |
| 2010/0187557 A1 | 7/2010 | Samoilov et al. | |
| 2010/0200998 A1 | 8/2010 | Furuta et al. | |
| 2010/0244217 A1 | 9/2010 | Ha et al. | |
| 2011/0024899 A1 | 2/2011 | Masumoto et al. | |
| 2011/0062572 A1 | 3/2011 | Steijer et al. | |
| 2012/0027234 A1 | 2/2012 | Goida | |
| 2013/0032388 A1 | 2/2013 | Lin et al. | |

* cited by examiner

*Primary Examiner* — Stephen W Smoot
(74) *Attorney, Agent, or Firm* — Knobbe, Martens, Olson & Bear LLP

(57) ABSTRACT

Packages and methods for 3D integration are disclosed. In various embodiments, a first integrated device die having a hole is attached to a package substrate. A second integrated device die can be stacked on top of the first integrated device die. At least a portion of the second integrated device die can extend into the hole of the first integrated device die. By stacking the two dies such that the portion of the second integrated device die extends into the hole, the overall package height can advantageously be reduced.

32 Claims, 8 Drawing Sheets

PACKAGES AND METHODS FOR 3D INTEGRATION INCLUDING TWO STACKED DIES WITH A PORTION OF ONE DIE EXTENDING INTO A HOLE OF THE OTHER DIE

BACKGROUND OF THE INVENTION

1. Field of the Invention

The field relates to integrated devices and methods for packaging the same. More particularly, the field relates to devices and methods for improving three-dimensional (3D) packaging and integration.

2. Description of the Related Art

Efforts are continually being made to minimize the size of integrated device packages. For example, it can be important to minimize both the height of an integrated device package (also referred to as "the package") and the footprint of the package on an external device substrate, such as a printed circuit board (PCB). The size of the package can be based at least in part on the type of device to be packaged. For example, some integrated device packages can include more than one integrated device die. In some implementations with multiple device dies, the dies can simply be placed side by side on a package substrate, such as a leadframe or a PCB material. Placing the device dies adjacent one another on the package substrate can occupy valuable package real estate and can disadvantageously enlarge the footprint of the package on the external device substrate.

One way to reduce the package footprint on the external device substrate is to stack multiple integrated device dies on top of one another, instead of placing them adjacent one another. While stacking can reduce the area of the package substrate (and thereby reduce the footprint on the external device substrate), stacking can also increase the height of the package. In some arrangements, the tradeoff of increased height for reduced package footprint can be desirable. However, in other arrangements, the increased package height may interfere with design parameters of the external device. For example, mobile devices (such as mobile smartphones and tablet computers) are often small and thin so that they can easily be carried by a user. Consequently, the integrated device packages within mobile devices must also be as small as possible in both package footprint, or horizontal dimension, and package height, or vertical dimension, to accommodate the many different components within a mobile device. While mobile devices have been discussed as one example of the need for low profile and low footprint packaging techniques, it should be understood that low profile and low footprint integrated device packaging can be beneficial in a variety of devices and arrangements.

Thus, it can be advantageous to further reduce the height of integrated device packages to improve 3D device integration, while maintaining a reduced package footprint.

SUMMARY

In one embodiment, a packaged integrated device is disclosed. The packaged integrated device can comprise a first integrated device die having a through hole. The packaged integrated device can further include a second integrated device die, wherein at least a portion of the second integrated device die extends into the through hole of the first integrated device die.

In another embodiment, a packaged integrated device is disclosed. The packaged integrated device include a first integrated device die comprising a hole and circuitry surrounding the hole. The packaged integrated device can further include a second integrated device die coupled to the first integrated device die, wherein a portion of the second integrated device die extends into the hole of the first integrated device die.

In yet another embodiment, an integrated circuit is disclosed. The integrated circuit can comprise an integrated circuit die, wherein a portion of the integrated circuit die is patterned with circuitry. Furthermore, a hole in the integrated circuit die can have a width of between about 900 micrometers and about 2.5 millimeters.

In another embodiment, an integrated device package is disclosed. The integrated device package can include a first integrated device die having a first male stacking feature and a second integrated device die having a first female stacking feature configured to receive the first male stacking feature. The first and second integrated device dies can be disposed in a stacking configuration. Further, the first male stacking feature can be received within the first female stacking feature.

In yet another embodiment, a method for creating a three-dimensional integrated package is disclosed. The method can comprise providing a first integrated device die having a hole through an upper surface of the first integrated device die. The method can further comprise providing a second integrated device die. Moreover, the method can include stacking the second integrated device die on the first integrated device die and inserting a portion of the second integrated device die inside the hole.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein.

DETAILED DESCRIPTION

For integrated device packages (also referred to as "packages" herein) having multiple integrated device dies, it can be advantageous to reduce both the package footprint and the package height. One way to reduce the package footprint on an external device substrate is to stack multiple integrated device dies instead of placing them adjacent one another on a package substrate. Such vertical stacking of chips is sometimes referred to in the art as three-dimensional (3D) packaging. Yet, in some embodiments, as described above, it can be desirable to balance the resulting increase in package height caused by stacking with the reduction in package footprint. Accordingly, it can be advantageous to design low profile packages (e.g., packages having a short height), while also maintaining a small package footprint on the external device substrate (such as a PCB).

Figure 1A:
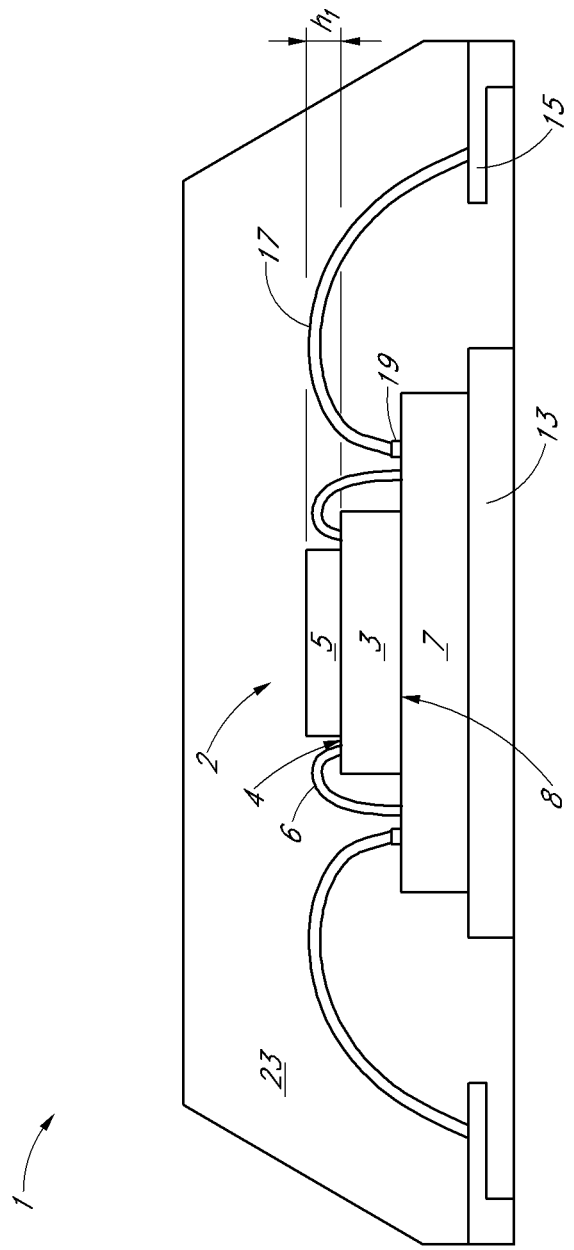
FIG. 1A is a schematic, elevational cross-sectional view illustrating an integrated device package having two stacked integrated device dies.

FIG. 1A is a side cross-sectional view illustrating an integrated device package 1. The integrated device package 1 in the example of FIG. 1A is a molded leadframe package having a die paddle 13 and multiple leads 15. The die paddle 13 can be configured to support one or more integrated device dies and can provide an electrical connection to an external device by way of an external device substrate like a PCB substrate or motherboard (not shown in the figures), also known as board mounting. In some implementations, it can be desirable to electrically connect the die paddle 13 to ground to enable grounding of integrated device dies.

The die paddle 13 can be electrically and physically separated from the leads 15, as illustrated in FIG. 1A. In some arrangements, the leads 15 are configured to electrically connect to corresponding electrical contacts on the external device substrate to provide an electrical connection between the integrated device die(s) and the external device. For example, in some implementations, the leads 15 can be soldered to the corresponding electrical contacts on the external device substrate to electrically couple the integrated device package 1 to the external device. In other implementations, the leads can be coupled to the electrical contacts via anisotropic conductive film (ACF) or nonconductive paste (NCP) technologies. In some arrangements the leads 15 and the die paddle 13 are made of copper (Cu), however other electrically conductive materials may be suitable as well. In addition, while a molded leadframe is used as a package substrate in the illustrated example, other types of package substrates can be used in other embodiments. For instance, instead of using a leadframe as the package substrate, a printed circuit board or ceramic material may be used in various implementations as the package substrate that additionally includes surface contact pads, internal or surface traces and external leads, and either encapsulation epoxy, a lid, or both.

In FIG. 1A, a first integrated device die 7 is mounted on the die paddle 13. In some arrangements, the first integrated device die 7 can be mounted on the die paddle 13 using an adhesive material, such as an epoxy or a conductive epoxy. In the illustrated embodiment of FIG. 1A, the first integrated device die 7 is an integrated circuit die, such as, e.g., an Application-Specific Integrated Circuit (ASIC) die, and can perform processing or pre-processing functions, such as converting analog signals to digital signals, for use by the larger electronic device in which the package 1 is connected. In other arrangements, however, the first integrated device die 7 can be a microelectromechanical systems (MEMS) die or any other suitable type of integrated device die.

The first integrated device die 7 can be electrically connected to one or more of the leads 15 using integrated circuit bonding wires 17. The integrated circuit bonding wires 17 can be made of gold, although other conductive materials are possible. As shown in FIG. 1A, the integrated circuit bonding wires 17 can couple to the first integrated device die 7 via bond pads 19 on the die 7. Bond pads 19, in turn, can correspond to a particular signal from the first integrated device die 7. The integrated circuit bonding wires 17 can thereby electrically connect desired output or input signals between the first integrated device die 7 and the leads 15, which, as described above, can electrically connect to electrical contacts on the external device substrate. Although FIG. 1A illustrates the use of bonding wires to connect the first integrated device die 7 to the leads of a molded leadframe, in other arrangements, there are various ways to electrically connect the first integrated device die 7 to the package substrate, e.g., by electrically coupling contacts on the bottom of the die to a printed circuit board substrate in a flip-chip arrangement.

FIG. 1A also illustrates a second integrated device die 2 stacked on top of the first integrated device die 7. As with the first integrated device die 7, the second integrated device die 2 can be mounted on the first integrated device die 7 using an adhesive. The illustrated second integrated device die 2 includes a base 3 and an attachment 5, which can also be referred to as a protrusion. The base 3 can have a first surface 8 and a second surface 4 substantially opposite the first surface 8. The first surface 8 of the base 3 can be attached to the first integrated device die 7 as shown in FIG. 1A. In the illustrated example of FIG. 1A, the second integrated device die 2 is a MEMS device die, although in other examples, the second integrated device die 2 can be any other suitable type of device die, such as a processor die or a memory device die. In FIG. 1A, the second integrated device die 2, which is a MEMS die in this example, can be any type of suitable MEMS die. For example, the second integrated device die 2 can be an accelerometer die, a gyroscope die, a microphone die, a pressure sensor die, or any other type of MEMS device die. As shown, the second integrated device die 2 can be electrically connected to the first integrated device die 7 via bonding wires 6. Bonding wires 6 can thereby provide electrical communication between the second integrated device die 2 (e.g., a MEMS die) and the first integrated device die 7. In such an arrangement, the first integrated device die 7 can process received signals or data from the second integrated device die 2 and then electrically communicate with the external device by way of the bonding wires 17 and the leads 15. In other embodiments, the second integrated device die 2 can be electrically coupled directly to the package substrate, e.g., the leads 15 of the leadframe in FIG. 1A, by way of the bonding wires.

In some arrangements, the attachment 5 can comprise a cap substantially enclosing a MEMS device formed on the base 3. The cap can be used to hermetically seal the MEMS device from the outside environs, in the case of a motion sensor, or can permit communication therethrough in the case of pressure or acoustic sensors. Thus, in some arrangements, the attachment 5 can be used to protect the MEMS device formed in the base 3 of the second integrated device die 2 from contamination and external loads applied to the package 1. In other arrangements, however, the attachment 5 can include part or all of a device hybridly attached to the base 3 such as a separately fabricated laser diode or optical sensor mounted and electrically integrated with the base 3. In still other arrangements, the attachment 5 can comprise a heat spreader. A skilled artisan will understand that there are numerous instances in which it may be useful to form a structure (e.g., the attachment 5 or other protrusion) that extends from or that is mounted on the base 3 of the second integrated device die 2.

The package 1 of FIG. 1A also optionally includes a molding material 23 that encapsulates the first integrated device die 7, the second integrated device die 2, the bonding wires 6, 17, the leads 15, and the die paddle 13. The molding material 23 can be any suitable encapsulating material, such as an epoxy. The molding material 23 can be used to protect the first and second integrated device dies 7, 2 from external loads applied to the package, contamination, and other environmental or operational loads. In other examples of packages, a package lid can be attached to a package substrate (such as a PCB substrate) to enclose the dies instead of or in addition to applying the molding material.

As illustrated in the integrated device package 1 of FIG. 1A, stacking the second integrated device die 2 on the first integrated device die 7 can reduce the footprint of the package by an amount at least equal to the bottom surface area of the smaller of the two dies. In other words, if the second integrated device die 2 were instead mounted on the die paddle 13 adjacent the first integrated device die 7, then the die paddle 13 (or packaging substrate, in other embodiments) would be substantially larger to accommodate the surface areas of both dies, thereby increasing the footprint of the package 1. While stacking the two dies reduces the package footprint, stacking also increases the package height (relative to positioning the two dies adjacent each other on the die paddle 13) by at least the thickness of the second integrated device die 2 (e.g., by the combined thickness of the base 3 and the attachment 5). As described above, in some arrangements, it can be desirable to reduce the package height to obtain a low-profile package 1.

Figure 1B:
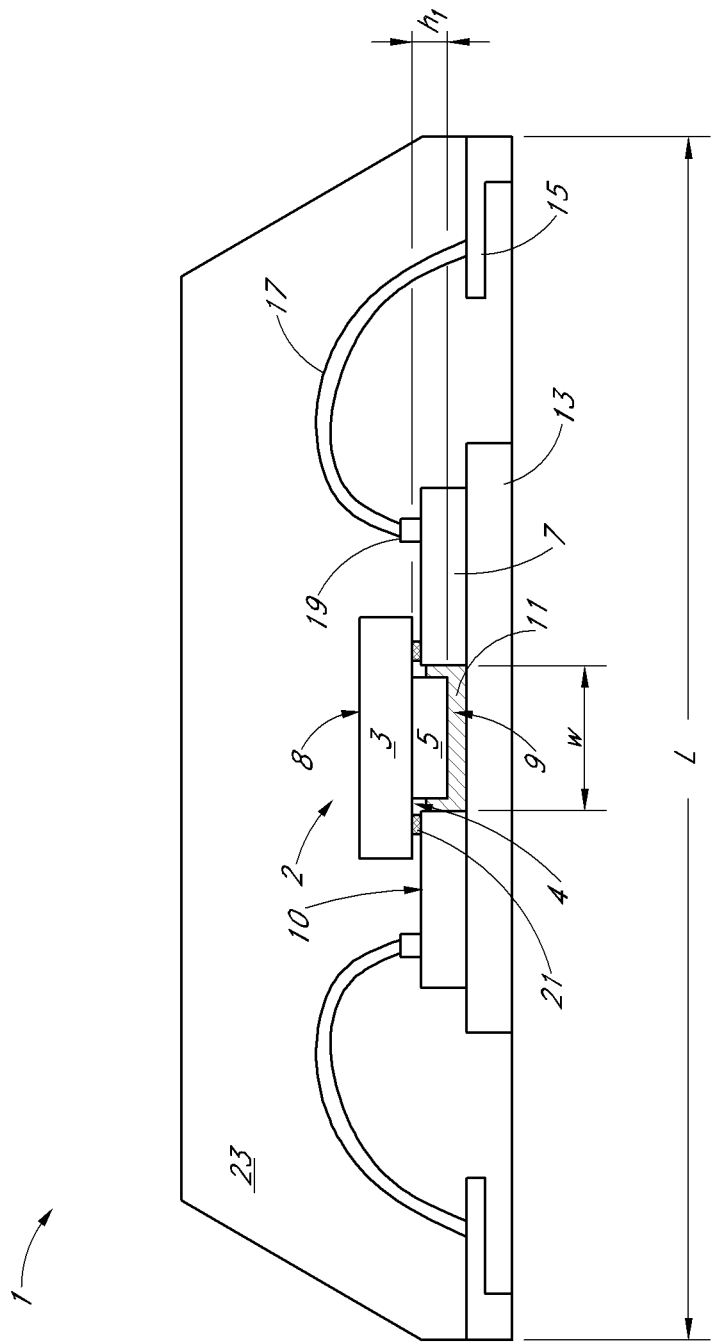
FIG. 1B is a schematic, elevational cross-sectional view illustrating an integrated device package having two stacked integrated device dies, with a portion of one of the integrated device dies extending into a through hole of the other integrated device die, according to one embodiment.

One way to reduce the package height is illustrated in FIG. 1B. Many of the components of FIG. 1B are substantially the same as those described above with respect to FIG. 1A, except for the distinctions described herein Like reference numerals are used to refer to like components of the package 1. Unlike the illustrated package of FIG. 1A, in FIG. 1B, the first integrated device die 7 includes a hole 9 through the first integrated device die 7. While the hole 9 illustrated in FIG. 1B is a through hole (e.g., formed through the entire thickness of the first integrated device die 7), in other embodiments, the hole 9 can comprise a recess formed only partly through the thickness of the first integrated device die 9.

In addition, unlike in FIG. 1A, the second integrated device die 2 is mounted on the first integrated device die 7 in a flip chip configuration, such that the attachment 5 extends at least partially into the hole 9. As shown, the base 3 of the second integrated device die 2 can be mounted on the first integrated device die 7 such that the second surface 4 that was facing upward in FIG. 1A faces downward in FIG. 1B, e.g., faces toward a top surface 10 of the first integrated device die 7. For example, in some embodiments, the second surface 4 of the second integrated device die 2 and the top surface 10 of the first integrated device die 7 can be active surfaces of the dies, e.g., the circuitry is formed closest to those surfaces and they can contain active electrical or mechanical elements, including bonding pads. The second integrated device die 2 can be electrically and mechanically coupled to the first integrated device die 7 by way of electrical contact bumps 21. As with the die bonding wires 6 of FIG. 1A, the electrical contact bumps 21 can be employed to electrically couple input or output signals from the second integrated device die 2 to the first integrated device die 7. In some embodiments, for example, solder bumps can be used to electrically and mechanically couple the second integrated device die 2 (e.g., the second surface 4 of the base 3 in some arrangements) to corresponding contacts on the first integrated device die 7. In other arrangements, electrically selectively conductive adhesive material (such as anisotropically conductive film, or ACF, or non-conductive paste, or NCP) can be used. In still other embodiments, the second integrated device die 2 can be coupled to the first integrated device die 7 as shown, but wire bonds can be used to electrically couple the second integrated device die 2 to the first integrated device die 7 (in which case electrical contacts can be formed on the second surface 8 of the base 3 facing upward in FIG. 1B). Skilled artisans will understand that there are yet other possible ways to electrically couple the second integrated device die 2 to the first integrated device die 7 and/or the package substrate (e.g., the leads 15).

Compared to the package 1 of FIG. 1A, the package height can be reduced in the embodiment of FIG. 1B. Because the attachment 5 (e.g., the cap) extends into the hole 9, the package height is correspondingly decreased by an amount equal to approximately the height of the attachment 5, e.g., $h_1$, when compared to the height of the package 1 in FIG. 1A. This reduction in package height can be beneficial for use in devices where both package height and package footprint is to be minimized. In some embodiments, for example, $h_1$ can be between about 150 microns and about 400 microns. More particularly, $h_1$ can be between about 250 microns and 300 microns in some embodiments. For example, $h_1$ can be about 250 microns, about 275 microns, or about 300 microns. Of course, other attachment heights are possible depending on the particular device used in the package.

The package 1 can have a package length, L, as shown in FIG. 1B, and a package width in a transverse direction (not shown in FIG. 1B). In some embodiments, the package length L and the package width can be substantially the same, while in other embodiments, the package length and width can differ. For example, the package footprint can be rectangular in some arrangements. In rectangular packages, the package can have a length L between about 3 mm and about 7 mm, and a package width between about 3 mm and about 7 mm. In other embodiments, the dimensions of the package can be smaller or larger than those disclosed above.

The shape of the hole 9 can also vary according to the shape of the attachment 5. In some embodiments, the hole 9 can be rectangular (or square) in shape, while in other embodiments the hole 9 can be circular. The width of the hole 9 can also vary according to the size of the attachment 5. Note that the width, W, of the hole 9 will be used herein to refer to the largest lateral dimension of the hole. For example, W can refer to the largest side length if the hole 9 is rectangular, or W can refer to the diameter if the hole 9 is circular. The width W of the hole 9 can be slightly larger than the width of the attachment 5. In some embodiments, the hole 9 can have a width W between about 900 microns and about 2.5 millimeters. In other embodiments, the hole 9 can have a width between about 1 millimeter and about 2 millimeters. Of course, in some arrangements, the width of the hole 9 can be less than or greater than the dimensions discussed above.

Figure 2A:
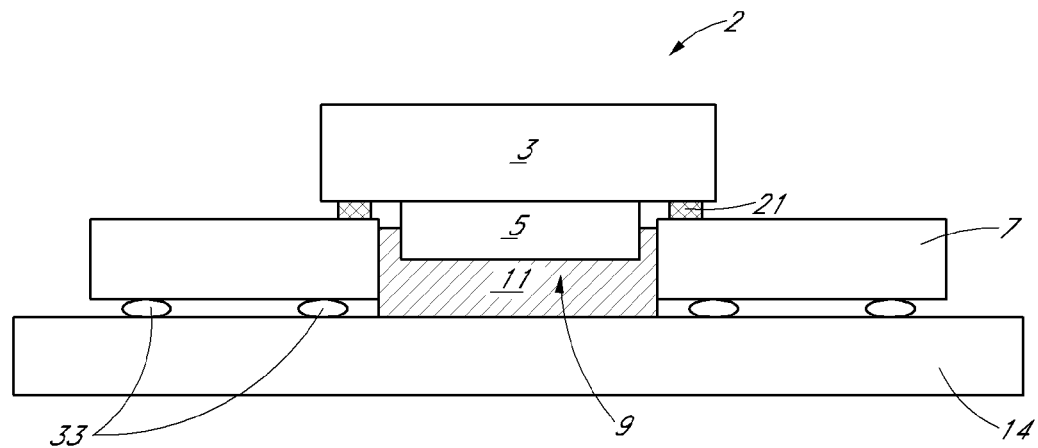
FIGS. 2A-2C are schematic, elevational cross-sectional views illustrating two stacked integrated device dies according to various embodiments.
Figure 2B:
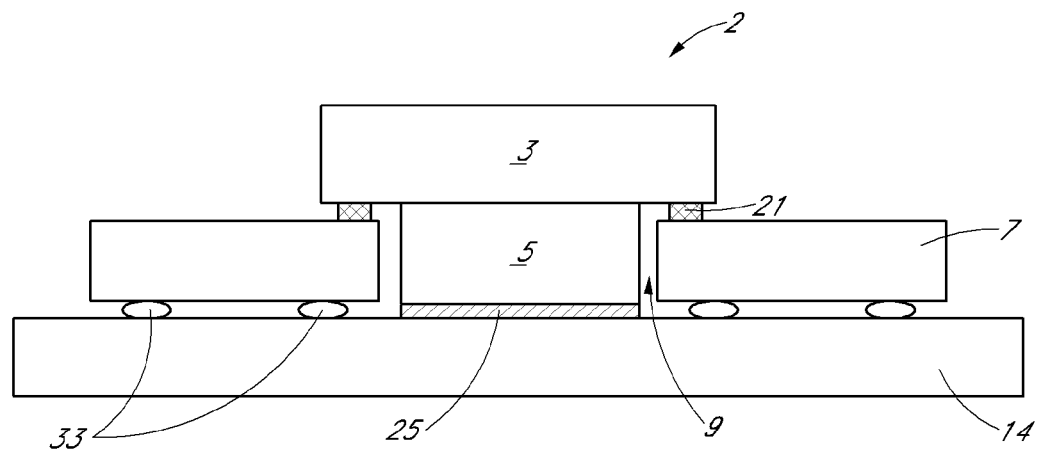
Figure 2C:
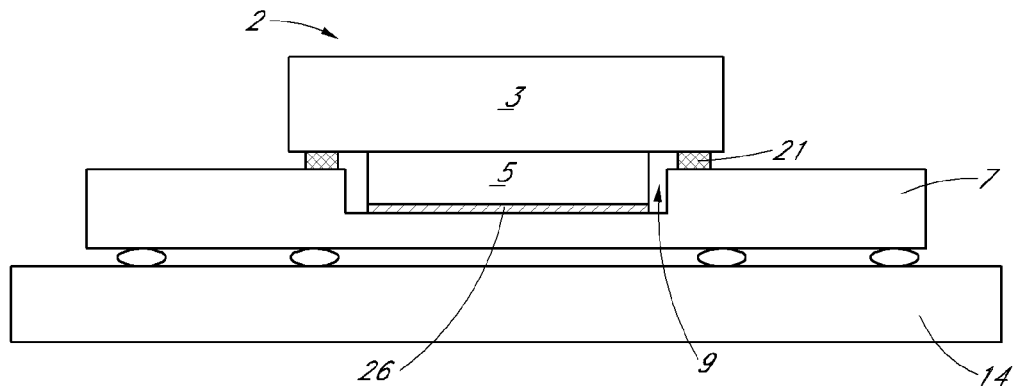
Figure 2D:
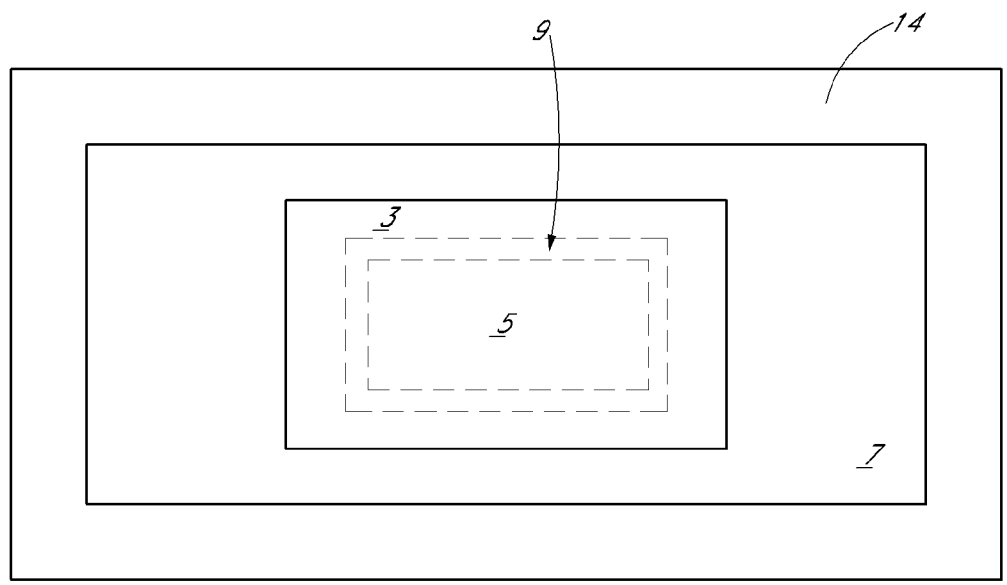
FIG. 2D is a top view illustrating the stacked integrated device dies of FIGS. 2A-2C.

FIGS. 2A-2C are schematic side cross-sectional views illustrating two stacked integrated device dies according to various embodiments. FIG. 2D is a top plan view of the embodiments illustrated in FIGS. 2A-2C. In the embodiments of FIGS. 2A-2D, however, a package substrate 14 is illustrated. In some embodiments, the package substrate 14 can be a molded leadframe structure comprising a die paddle and multiple leads. In other embodiments, the package substrate 14 can comprise a printed circuit board or ceramic material. Only the package substrate 14 is shown in FIGS. 2A-2D for purposes of illustration, however it should be appreciated that encapsulating material (or a package lid), wire bonds (or other electrical interconnects), and leads (or other electrical contacts) can also be provided as described above with respect to FIGS. 1A and 1B. As illustrated in FIG. 2A, the first integrated device die 7 can electrically communicate with the package substrate 14 by way of solder bumps 33. Alternatively, the first integrated device die 7 can couple to the package substrate 14 in other suitable arrangements, including, e.g., wire bonding or ACF or NCP technologies. Moreover, the first integrated device die 7 can include through silicon vias (TSVs) that provide electrical communication between the top and bottom surfaces of the integrated device die 7 to enable electrical communication between the second integrated device die 2 and the package substrate 14.

As illustrated in FIG. 1B and in FIG. 2A in more detail, the first integrated device die 7 can include a hole through the entire thickness of the die. As illustrated in FIG. 2A, the attachment 5 can extend only partially through the thickness of the first integrated device die 7, such that there is a space between the bottom of the attachment 5 and the package substrate 14. In these embodiments, the attachment 5 may or may not be configured to electrically communicate with the first integrated device die 7 and/or the package substrate 14. In some arrangements, the attachment 5 can be surrounded by a solid filler material 11 within the hole 9. In one embodiment, air can provide a low stress interface between the attachment 5, the first integrated device die 7, and the package substrate 14. In other embodiments, however, the filler material 11 can comprise a polymer molding material to protect the attachment 5. In other implementations, silicone can be used to surround the attachment 5. In yet other embodiments, an epoxy or other type of adhesive can be applied to the attachment to assist in coupling the second integrated device die 2 to the first integrated device die 7 and/or the package substrate 14. In some embodiments, the epoxy can include thermally conductive filler material, such as carbon black, to provide a thermal path between the second integrated device die 2 and the package substrate 14.

In FIG. 2B, the hole 9 is a through hole, as in FIGS. 1B and 2A. However, unlike in FIG. 2A, the attachment 5 extends through the entire thickness of the first integrated device die 7 to contact the package substrate 14. The embodiment illustrated in FIG. 2B can be useful for a variety of implementations. For example, the attachment 5 can serve as a thermally conductive heat sink that provides a thermal pathway between the second integrated device die 2 and the package substrate 14. The attachment 5 (e.g., the heat sink) can be coupled to the package substrate 14 by way of a thermally conductive adhesive 25, or by any other suitable contact. In other embodiments, however, no adhesive is necessary, as proximity or mechanical contact between the attachment 5 and the package substrate 14 can be a sufficient thermal interface in some cases. The attachment 5 can therefore advantageously transmit heat that is generated within the second integrated device die 2 directly to the package substrate 14, which can then be efficiently transferred out of the package 1. This implementation allows for efficient heat transfer away from the second integrated device die 2 without requiring a thermal pathway from the second integrated device die 2 to the first integrated device die 7. In other embodiments, the attachment 5 can also electrically communicate directly with the package substrate 14. For example, the attachment could be electrically connected to ground by way of electrically coupling directly to the package substrate 14, by way of, e.g., a wire bond.

Turning to FIG. 2C, another embodiment illustrating two stacked integrated device dies is shown. Unlike FIGS. 2A and 2B, however, the hole 9 in the first integrated device die 7 is a recessed region formed through a top surface of the first integrated device die 7. In the embodiment of FIG. 2C, therefore, the base 3 of the second integrated device die 2 can be mechanically and/or electrically coupled to the first integrated device die 7 by way of the electrical contact bumps 21. The attachment 5 can be mechanically coupled to the first integrated device die 7, or, similar to the embodiment of FIG. 2A, the attachment may be free within the hole 9 and/or surrounded by a filler material. As shown in FIG. 2C, the attachment can be mechanically coupled to the first integrated device die 7 by an attachment contact 26. The attachment contact 26 can mechanically couple the attachment 5 to the first integrated device die 7 using an adhesive material or solder (or also a thermally conductive material to assist in heat dissipation). The hole 9 in FIGS. 2A-2D can be shaped and dimensioned as described above with respect to FIG. 1B.

Turning to FIGS. 3A-1, 3A-2, 3B, and 3C, various embodiments of the first integrated device die 7 are shown. As mentioned above, the first integrated device die 7 can be an integrated circuit die in various embodiments, such as, e.g., a processor or ASIC die. For example, the integrated device die 7 can include processing circuitry 32 proximate the surface of the die and extending into the die. In embodiments where the second integrated device die 2 is stacked on top of the first integrated device die 7, for example, the processing circuitry can receive electrical signals from the second integrated device die 2 by way of, e.g., the electrical contact bumps 21. The processing circuitry 32 of the first integrated device die 7 can receive raw data from a MEMS sensor formed in the second integrated device die 2 and can process the received data into a useful output signal readable by the external device. As above, a portion of the second integrated device die 2 can extend into the hole 9 to reduce the height of the package 1. The hole 9 can be circular (as in FIG. 3A-1), rectangular (as in FIG. 3A-2), or any other suitable shape.

Figures 1, 3A:
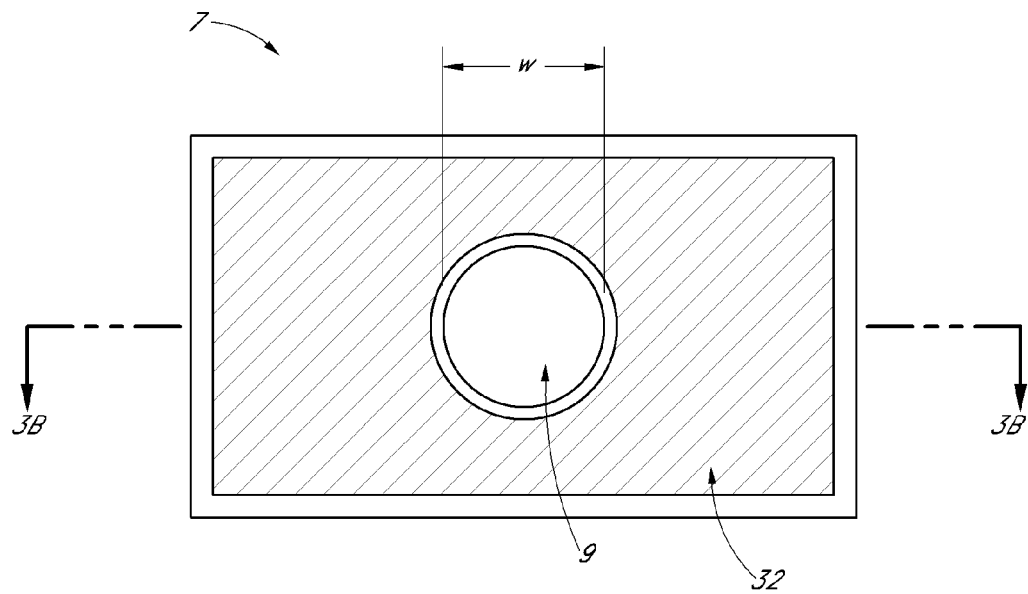
FIGS. 3A-1 and 3A-2 are a schematic top view illustrating an integrated circuit die having a through hole or a recessed region therein, according to various embodiments.
Figures 2, 3A:
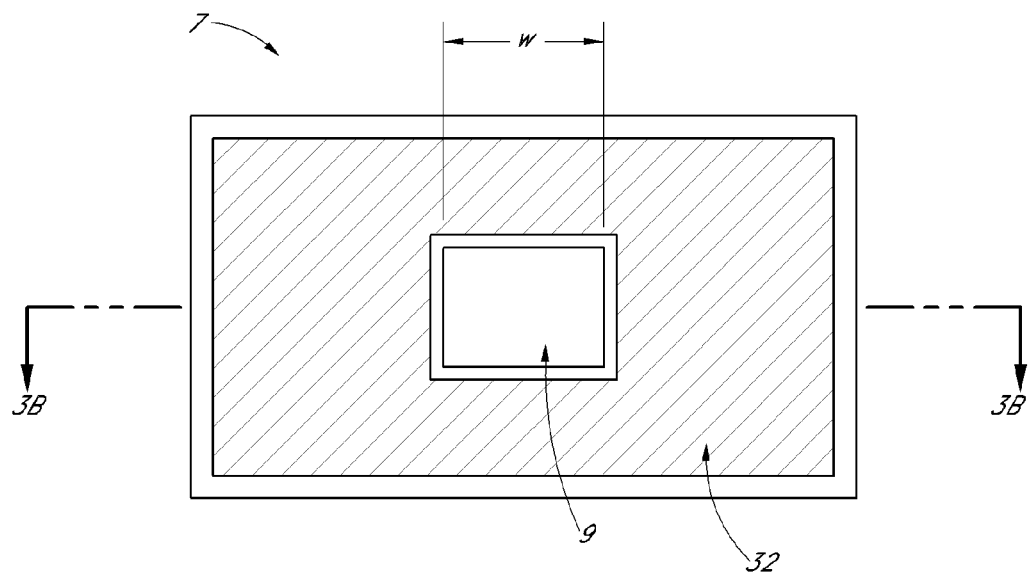
Figure 3B:
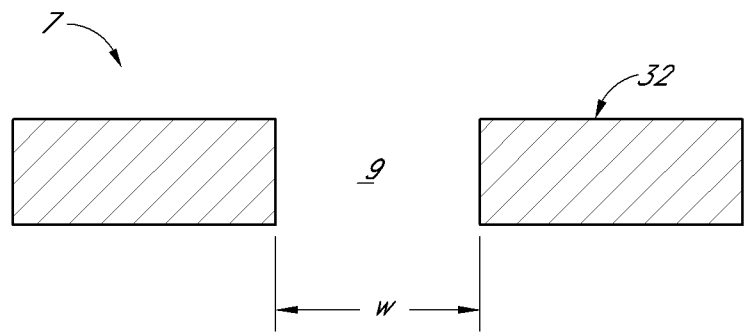
FIGS. 3B and 3C are schematic, elevational cross-sectional views illustrating the integrated circuit dies of FIGS. 3A-1 and 3A-2, according to various embodiments.
Figure 3C:
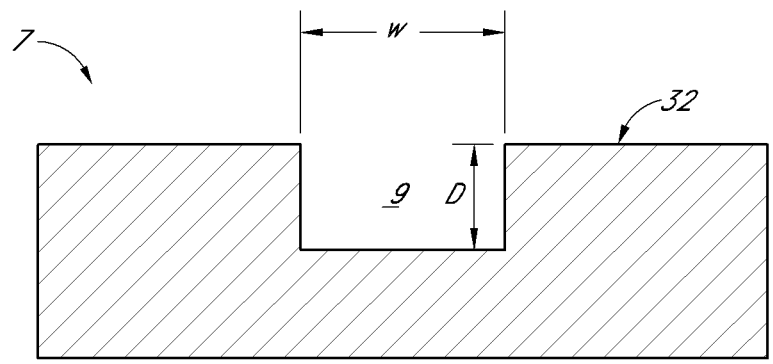

As FIG. 3B illustrates, the hole 9 can be a through hole formed through the entire thickness of the first integrated device die 9. However, as FIG. 3C illustrates, the hole 9 can also be a recess formed through an active surface of the die that contains a portion of the circuitry 32. In various embodiments, the depth D of the hole 9 can be between about 25% and about 85% of the thickness of the first integrated device die 9. In other embodiments, the depth D can be between about 50% and about 75% of the thickness of the first integrated device die 9. For example, in some embodiments, the depth D of the hole 9 can be between about 50 microns and about 500 microns. In still other embodiments, the depth D can be between about 75 microns and about 400 microns. Other hole depths are possible, such as hole depths larger or smaller than those described above. For example, in embodiments where the attachment 5 extends into the hole 9, the depth D can be designed to be as large or as small as necessary to accommodate the height $h_1$ of the attachment 5.

Figure 4A:
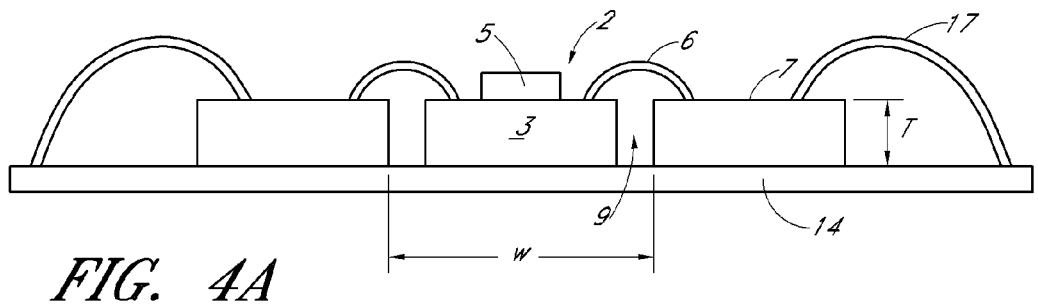
FIGS. 4A-4C are schematic, elevational cross-sectional views illustrating an integrated device die nested within another integrated device die, according to various embodiments.
Figure 4B:
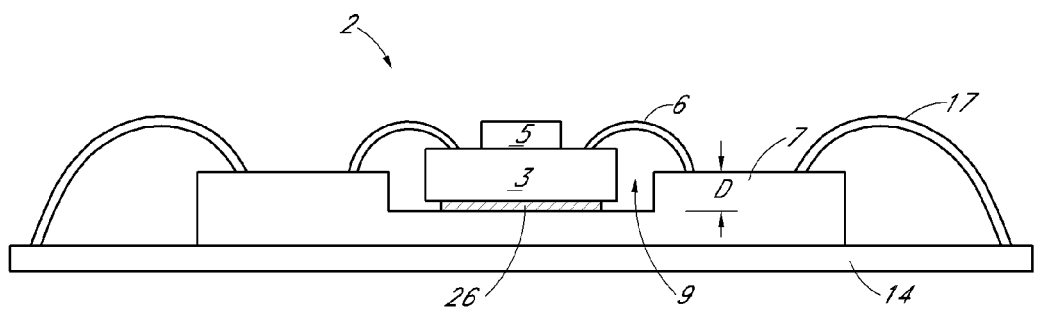
Figure 4C:
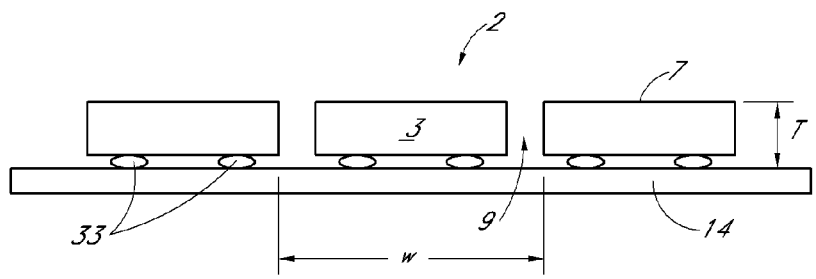

In FIGS. 4A and 4B, the hole 9 in the first integrated device die 7 is shaped and dimensioned to receive the outer lateral dimensions of the second integrated device die 2. As shown in FIGS. 4A and 4B, the second integrated device die 2 can therefore be nested entirely within the hole 9 of the first integrated device die 7. Because the outer lateral dimensions of the second integrated device die 2 (e.g., the outer dimensions of the base 3) fit within the hole 9, the second integrated device die 2 can be mounted entirely within the hole 9 formed in the first integrated device die 7. Also note that while the attachment 5 is illustrated as protruding above the first integrated device die 7, it should be appreciated that the second integrated device die 2 can be sized such that the attachment 5 is also entirely nested within the hole 9, e.g., such that the top surface of the first integrated device die 7 can be above (or flush with) the top of the attachment 5. The illustrated nesting configuration can reduce the package height by an amount approximately equal to the thickness T of the first integrated device die 7 in the case of a through hole (e.g., FIG. 4A) or by the depth D of the recess (e.g., FIG. 4B). If the thickness (or height) of the second integrated device die 2 is less than the thickness T of the first integrated device die 7 or the depth D of the recess, then the package height can be reduced by an amount approximately equal to the thickness of the second integrated device die 2. The width W and depth D of the hole can be dimensioned as described in detail above. Moreover, while the attachment 5 has been illustrated in FIGS. 4A and 4B, in the embodiment of FIG. 4C, there may be no attachment 5 extending from the base 3 of the second integrated device die 2.

Because the second integrated device die 2 is nested within the first integrated device die 7 in some embodiments, the second integrated device die 2 can be electrically coupled to the first integrated device die 7 via the die bonding wires 6, e.g., as illustrated in FIGS. 4A and 4B. In other arrangements, the second integrated device die 2 can be mounted to the first integrated device die 7 or the package substrate 14 in a flip chip configuration. For example, in FIG. 4C, the first integrated device die 7 and the second die 2 can be mounted in a flip-chip configuration to the package substrate 14 and can electrically couple to the package substrate 14 via solder bumps 33 or other suitable connection as discussed above. Of course, the dies in FIGS. 4A and 4B can similarly be mounted in a flip chip configuration (as opposed to wire bonding), and the dies in FIG. 4C can electrically couple to the package substrate using wire bonding (as opposed to a flip chip configuration).

Figure 5:
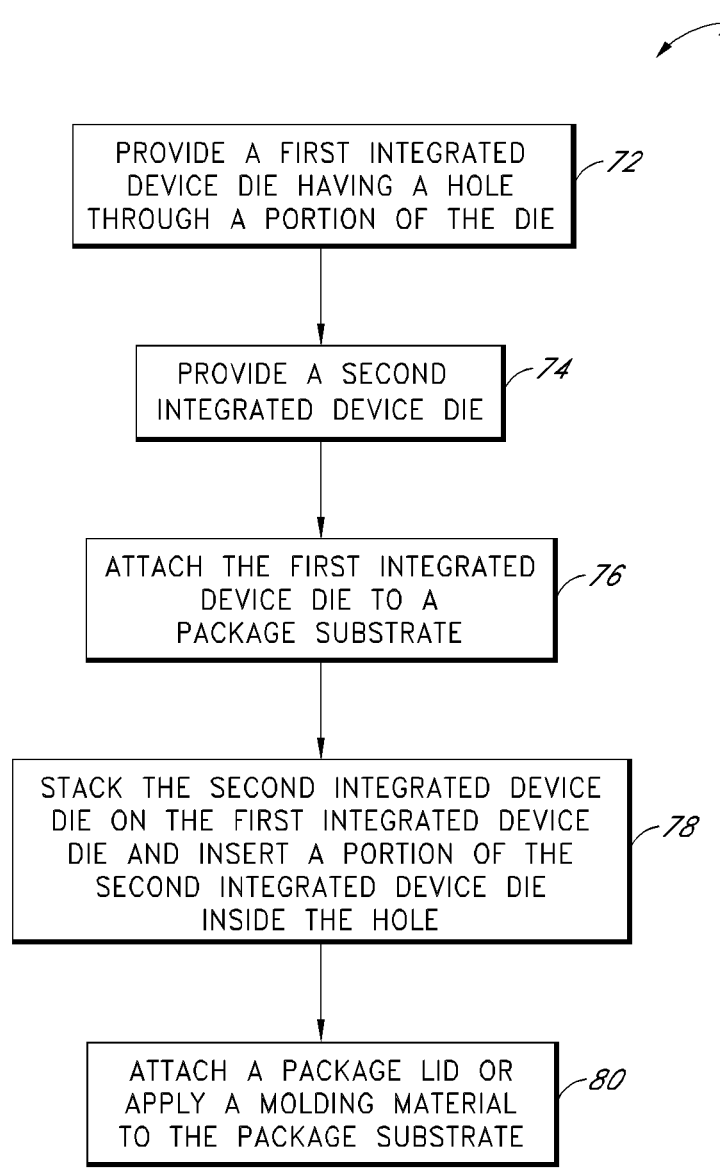
FIG. 5 is a flowchart illustrating a method for packaging two integrated device dies according to one embodiment.

Turning to FIG. 5, a flowchart illustrating one method 70 for creating a three-dimensional integrated package is disclosed. In Block 72, a first integrated device die having a hole through a portion of the die is provided. In some embodiments, the hole can be formed via a wet or dry etch process. In yet other embodiments, the hole can be formed by mechanical means, including drilling, grinding, or other methods known to skilled artisans. The hole can be provided at the wafer level before dicing or after dicing. As described above, the hole can be a through hole or a recess. In addition, the first integrated device die can be an integrated circuit die in some embodiments, while in other embodiments, the first integrated device die can be a memory die or a MEMS die.

In Block 74, a second integrated device die is provided. As above, the second integrated device die can be a MEMS die in some embodiments, while in other embodiments, the second integrated device die can be an integrated circuit or memory die, or any other suitable type of die. In various MEMS implementations, the second integrated device die can be an accelerometer die, a gyroscope die, a pressure sensor die, or any other type of MEMS device die.

In block 76, the first integrated device die is attached to a package substrate. In some embodiments, the package substrate can be a leadframe or a molded leadframe structure, having a die paddle and a plurality of leads. In other embodiments, the package substrate can be a substrate made out of a PCB or ceramic material. Skilled artisans will understand that a variety of package substrates can be used with the disclosed embodiments.

Turning to Block 78, the second integrated device die is stacked on the first integrated device die, and a portion of the second integrated device die is inserted inside the hole in the first integrated device die. In some embodiments, the portion can be an attachment or protrusion extending from the base of the die can be inserted into the hole, such as a cap on a MEMS motion sensor. The portion inserted into the hole can form a thermal heat path to an underlying package substrate in some implementations. In other implementations, the portion can be electrically connected to the package substrate.

In Block 80, a package lid is attached to, or a molding material is applied to, the package substrate. In embodiments employing a PCB substrate, for example, it may be desirable to attach a package lid to protect the dies and any bonding wires without applying stress to the dies. Alternatively, a molding material can encapsulate the package.

Although the blocks illustrated in FIG. 5 have been presented in a particular order, the steps need not be performed in that order. For instance, the second integrated device die can be stacked on the first integrated device die before the first integrated device die is attached to the package substrate. Skilled artisans will understand that other variations in the order of method 70 are possible.

Applications

Devices employing the above described schemes can be mounted into various electronic devices. Examples of the electronic devices can include, but are not limited to, consumer electronic products, parts of the consumer electronic products, electronic test equipment, etc. Examples of electronic products can include, but are not limited to, a gaming device, a mobile phone, a computer, a hand-held or tablet computer, a personal digital assistant (PDA), an automobile, a multi functional peripheral device, medical devices, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A packaged integrated device comprising:
a first integrated device die having a through hole; and a second integrated device die stacked on a surface of the first integrated device die, wherein a portion of the second integrated device die extends into the through hole of the first integrated device die.

2. The packaged integrated device of claim 1, wherein the through hole has a width that is larger than a width of the portion of the second integrated device die that extends into the through hole.

3. The packaged integrated device of claim 2, wherein the through hole has a width of between about 1 millimeter and about 2 millimeters.

4. The packaged integrated device of claim 1, wherein the first integrated device die is an integrated circuit die, and wherein the second integrated device die is a microelectromechanical systems (MEMS) die.

5. The packaged integrated device of claim 4, wherein a cap of the MEMS die extends into the through hole.

6. The packaged integrated device of claim 4, wherein the MEMS die comprises one selected from the group consisting of: a MEMS microphone die, a MEMS accelerometer die, and a MEMS gyroscopic device die.

7. The packaged integrated device of claim 1, wherein a filler material is disposed around the portion of the second integrated device die that extends into the through hole.

8. The packaged integrated device of claim 7, wherein the filler material is silicone or a conductive epoxy.

9. The packaged integrated device of claim 1, wherein the second integrated device die is mounted to the first integrated device die in a flip-chip configuration.

10. A packaged integrated device comprising:
a first integrated device die having a through hole; and
a second integrated device die, wherein at least a portion of the second integrated device die extends into the through hole of the first integrated device die,
wherein the portion of the second integrated device die that extends into the through hole is a thermally conductive heat sink configured to provide a heat path from the second integrated device die to a package substrate underlying the first integrated device die.

11. A packaged integrated device comprising:
a first integrated device die having a through hole;
a second integrated device die, wherein at least a portion of the second integrated device die extends into the through hole of the first integrated device die; and
a package substrate electrically coupled to the first integrated device die, wherein the package substrate comprises a molded leadframe structure, and wherein the first integrated device die is mounted to a die paddle of the molded leadframe structure.

12. The packaged integrated device of claim 11, further comprising a molding material substantially encapsulating the first and second integrated device dies.

13. A packaged integrated device comprising:
a first integrated device die comprising a hole and circuitry surrounding the hole; and
a second integrated device die stacked on a surface of the first integrated device die, wherein a portion of the second integrated device die extends into the hole of the first integrated device die.

14. The packaged integrated device of claim 13, wherein the hole comprises a through hole.

15. The packaged integrated device of claim 13, wherein the hole comprises a recessed region in a surface of the first integrated device die.

16. The packaged integrated device of claim 15, wherein the recessed region has a depth of between about 75 micrometers and about 400 micrometers.

17. The packaged integrated device of claim 13, wherein the hole has a width of between about 1 millimeter and about 2 millimeters.

18. A packaged integrated device comprising:
a first integrated device die comprising a hole and circuitry surrounding the hole; and
a second integrated device die coupled to the first integrated device die, wherein at least a portion of the second integrated device die extends into the hole of the first integrated device die,
wherein the first integrated device die is a processor die, and wherein the second integrated device die is a microelectromechanical systems (MEMS) die.

19. The packaged integrated device of claim 18, wherein the portion of the second integrated device die that extends into the hole is a protective cap covering a MEMS device formed on the MEMS die.

20. The packaged integrated device of claim 18, wherein the MEMS die is mounted to the processor die in a flip-chip configuration such that an active surface of the MEMS die faces an active surface of the processor die, and wherein a portion of the active surface of the MEMS die is electrically coupled to a portion of the active surface of the processor die.

21. The packaged integrated device of claim 20, further comprising a package substrate electrically coupled to the processor die, and a molding material covering the package substrate and substantially enclosing the processor and MEMS dies.

22. An integrated circuit comprising:
an integrated circuit die, wherein a portion of the integrated circuit die is patterned with circuitry, the integrated circuit die comprising a first electrical contact pad configured to electrically communicate with a second integrated device die and a second electrical contact pad configured to electrically communicate with a package substrate; and
a hole in the integrated circuit die having a width of between about 900 micrometers and about 2.5 millimeters,
wherein the first electrical contact pad is disposed nearer the hole than the second electrical contact pad.

23. The integrated circuit of claim 22, wherein the hole has a width of between about 1 millimeter and about 2 millimeters.

24. The integrated circuit of claim 22, wherein the hole is a through hole.

25. The integrated circuit of claim 22, wherein the hole is a recessed region in the integrated circuit die having a depth of between about 50% and about 75% of the thickness of the integrated circuit die.

26. The integrated circuit of claim 22, wherein the hole is a recessed region in the integrated circuit die having a depth of between about 75 micrometers and about 400 micrometers.

27. The integrated circuit of claim 22, wherein the circuitry is annularly disposed around the hole.

28. The integrated circuit of claim 22, wherein the hole is shaped to receive at least a portion of a second integrated device die within the hole.

29. The integrated circuit of claim 28, wherein the hole is shaped to receive the outer dimensions of the second integrated device die.

30. The integrated circuit of claim 28, wherein the integrated circuit die is configured to receive the second integrated device die in a stacking configuration and to electrically couple to the second integrated device die.

31. The integrated circuit of claim 22, wherein the first electrical contact pad and the second electrical contact pad are on opposite surfaces of the integrated circuit die.

32. An integrated device package comprising:
- a first integrated device die having a first male stacking feature;
- a second integrated device die having a first female stacking feature configured to receive the first male stacking feature; and
- wherein the first and second integrated device dies are disposed in a stacking configuration such that the first integrated device die is stacked on a surface of the second integrated device die, and wherein the first male stacking feature is received within the first female stacking feature.

* * * * *